United States Patent [19]
Karpinski

[11] Patent Number: 5,128,951
[45] Date of Patent: Jul. 7, 1992

[54] LASER DIODE ARRAY AND METHOD OF FABRICATION THEREOF

[76] Inventor: Arthur A. Karpinski, Barker Rd., Jordan, N.Y. 13080

[21] Appl. No.: 663,357

[22] Filed: Mar. 4, 1991

[51] Int. Cl.⁵ .................................................. H01S 3/19
[52] U.S. Cl. ......................................... 372/50; 372/45; 351/55; 351/80
[58] Field of Search ................... 372/50, 45, 97, 36; 357/55, 80

[56] References Cited

U.S. PATENT DOCUMENTS

| | | | |
|---|---|---|---|
| 4,881,237 | 11/1989 | Donnelly | 372/50 |
| 5,031,187 | 7/1991 | Overstein et al. | 372/50 |
| 5,040,187 | 8/1991 | Karpinski | 372/50 |

Primary Examiner—William L. Sikes
Assistant Examiner—Susan S. Morse
Attorney, Agent, or Firm—Sughrue, Mion, Zinn Macpeak & Seas

[57] ABSTRACT

A laser diode array in which a conductive layer is provided over a nonconductive or insulating layer, grooves being formed in the conductive layer, and laser diodes being disposed in the grooves. In one embodiment, the layers are separate; in another embodiment, the conductive and nonconductive layers are provided in the same monolithic substrate, which may be undoped semiconductor material such as silicon, with a highly doped upper portion in which the grooves are formed. In another embodiment of the array, the diodes are mounted in the grooves such that at least a portion of their light is emitted towards a bottom of the array.

13 Claims, 5 Drawing Sheets

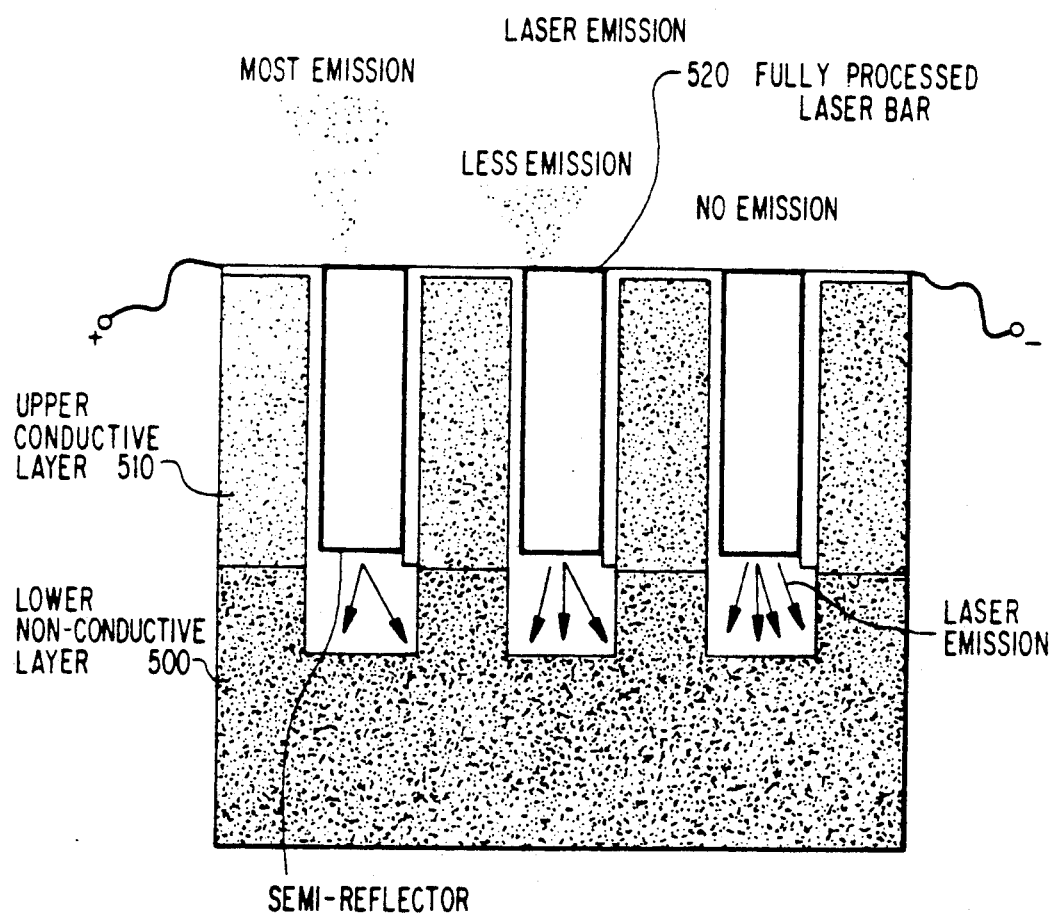

LASER DIODE ARRAY AND METHOD OF FABRICATION THEREOF

BACKGROUND OF THE INVENTION

The present invention is related to copending U.S. patent application Nos. 07/460,459, now U.S. Pat. No. 5,040,187 and 07/607,341 still pending, which is a divisional of U.S. Pat. No. 07/460,459. The contents of these copending applications are incorporated herein by reference.

The present invention relates to a one-dimensional or two-dimensional laser diode array, and particularly to a structure for mounting one or a plurality of laser diodes on a substrate, which may or may not be monolithic, as a subassembly of a working laser device, and to a method of fabrication of such a subassembly. The invention has application in many areas in which high power semiconductor laser arrays are used, including satellite communications, directed energy applications, remote sensing of atmospheric conditions, range finding, and isotope separation. Other applications include optical recording, computing, laser machining, level sensing, and remote sensing.

The above-mentioned copending applications discuss known laser packaging techniques, and the deficiencies of those techniques. These applications describe and claim a less expensive, more efficient approach to manufacture of laser arrays through facilitation of mounting of laser diodes on a monolithic substrate.

FIG. 1A shows a monolithic substrate 10 provided according to the techniques described in the copending applications. The substrate 10 may be formed of BeO (which may be small grain BeO), AlN, or any highly thermally conductive material. The substrate 10 may be relatively large at first, and then may be cut into smaller arrays, or submounts, at an appropriate step in the fabrication process. Grooves 20 formed in the substrate 10 may be provided with a rounded bottom as shown.

Referring to FIG. 1B, metallization layer 30 is provided, using one or more of Cr, Ti, Ni, Au, or Ag, or alloys thereof, or any suitably conductive material that adheres sufficiently to the substrate. Metallization of the substrate decreases the size of the grooves. Metallization may be removed from the bottom of each groove by shadowing or masking to provide electrical isolation. As shown in FIG. 1C, after the metallization step, laser diodes 40 may be loaded into each array.

FIG. 2A shows a 2D array module with a solder bond 70, and a BeO heat spreader (which is optional) and electrical interconnect 75 with electrical isolation points 80. Heat flows from the array, through the heat spreader; light goes in the opposite direction. Instead of a heat spreader, a thicker substrate 10 may be used, in which case the thicker bottom portion of the substrate would spread heat. FIG. 2B shows the FIG. 2A structure, bonded via a solder bond 85 to a water-cooled copper heat sink 90. A polymide, fiberglass, or other suitable insulator 95 also is provided.

While the foregoing structure is advantageous because of the relative ease of fabrication of the array, it would be desirable to have a structure which did not require a separate metallization layer within the grooves into which the laser diodes are placed.

SUMMARY OF THE INVENTION

In view of the foregoing, it is one object of the present invention to provide a laser diode array wherein the grooves in which the diodes are placed are made conductive without the necessity of performing a separate processing step to provide a metallization layer within the grooves.

This and other objects of the invention are provided in the inventive laser diode array, wherein an electrical insulating or semi-insulating layer has a conductive layer formed thereon. The conductor and insulator are bonded, or grown, or plated in any of a number of known manners. Grooves then are cut or etched to form channels in the conductor or conductive layer. The grooves may or may not extend into the insulating layer.

In accordance with one embodiment of the invention, the insulating and conductive layers are physically separate layers. Another embodiment of the invention employs a monolithic approach, wherein an upper portion of a single substrate, such as a semiconductor substrate, may be doped so as to be very conductive, the lower portion of the substrate being undoped, and hence less conductive or nonconductive.

BRIEF DESCRIPTION OF THE DRAWINGS

The foregoing and other objects and advantages of the invention may be understood readily from the following detailed description provided in conjunction with the accompanying drawings, in which:

FIGS. 7A and 7B show an alternative implementation of the invention providing selective emission of laser diodes in the array.

DETAILED DESCRIPTION OF THE PREFERRED EMBODIMENTS

Figure 3A:
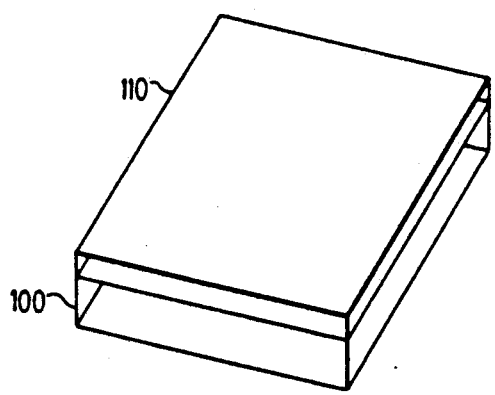
FIGS. 3A and 3B show steps of formation of the inventive array using an insulator and a conductor.

In FIG. 3A, a conductive layer 110 is placed on an electrical insulator 100. The conductive layer 110 can be a thin sheet of metal which is placed on the insulator 100, or may be metal plating, or thick film or thin film material. The electrical insulator 100 may be constituted by ceramic, diamond, BeO (which may be small grain BeO), AlN, undoped semiconductor such as silicon or gallium arsenide, or any thermally conductive material. In another embodiment, a single monolithic substrate such as a semiconductor substrate is provided, one portion being undoped and hence relatively non-conductive, and another portion being highly doped and hence relatively conductive. The grooves would be formed in the highly doped portion. The alternative embodiment will be described in greater detail below.

Figure 3B:
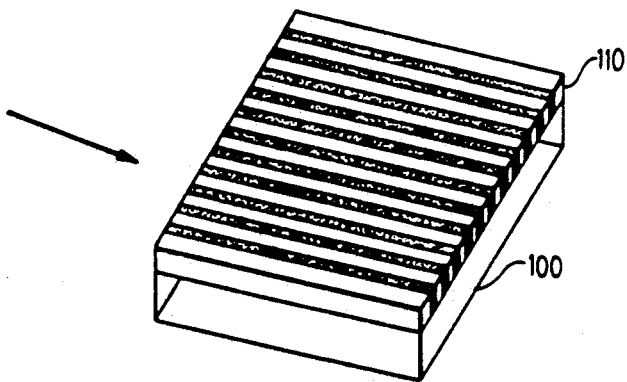

The conductor 110 and the insulator 100 are bonded together, or alternatively the conductive layer 110 is grown or plated on the insulator 100. As shown in FIG. 3B, grooves 120 then are formed by removal of some of the conductive layer. The removal may be achieved by chemical etching, or by machining. Where mechanical machining, as by cutting or sawing is carried out, it is possible that the grooves will extend into the insulative or nonconductive layer 100, as shown in the side view of the array in FIG. 4.

Typically, the preferred thickness of the nonconductive and conductive layers together will be 0.050 to 0.075 inches, the grooves being 0.004 inches wide and 0.020 inches deep. These dimensions are consistent with those described in the above-mentioned copending applications.

Figure 5:
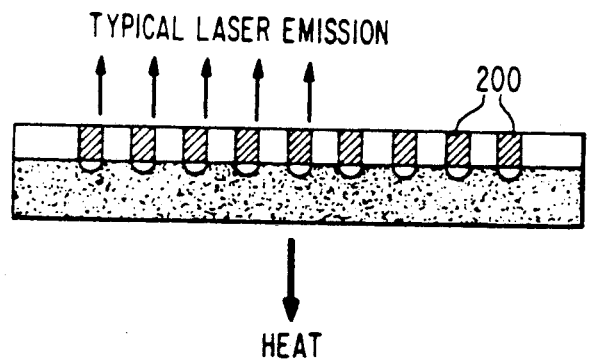
FIG. 5 shows a completed array with laser diodes implanted in the grooves of the device of FIG. 4.

FIG. 5 shows a composite design in which laser bars 200 are mounted in the grooves 120. The bars are dropped into place and soldered therein, as in the design discussed in the above-mentioned copending applications. As seen in FIG. 5, electrical power is input at the left hand side of the Figure, and is output at the right hand side, laser emission typically exiting through the top of the array. Heat is dissipated from the bottom of the array.

Figure 6:
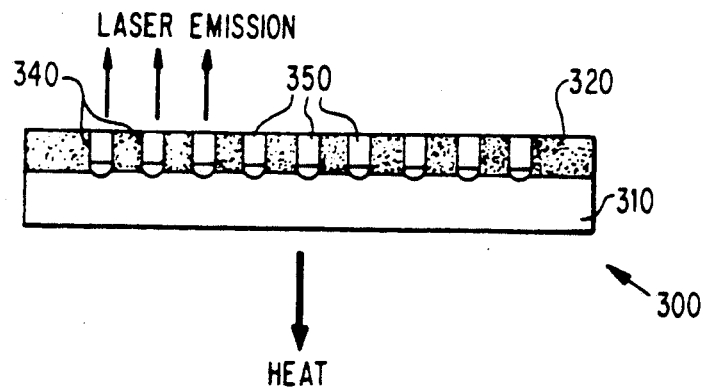
FIG. 6 shows an alternative embodiment using a doped substrate.

FIG. 6 shows an alternative embodiment in which, instead of separate nonconductive and conductive layers, a single dopable substrate 300, typically of silicon but also possibly of gallium arsenide or other suitable semiconductor, is provided. In this substrate 300, an upper portion 320 is highly doped to make it conductive. The lower portion 310 is undoped, and is nonconductive. Doping a monolithic substrate in this fashion to form a monolithic design will lend itself well to very high production capacities, as only a single material is used, replacing a separate attachment step with a suitable doping step. Doping may be carried out using any of a variety of known techniques, including simple diffusion, or ion implantation or epitaxial techniques. One example of the diffusion technique would be as follows. The substrate 300 is heated to 800° C. to 1300° C. in a sealed quartz tube, into which a controlled dopant is introduced. The dopant diffuses into the semiconductor, changing the electrical resistance of the semiconductor. This type of process can be controlled easily to assure a proper diffusion depth, as is required to fabricate laser mounts using semiconductor material.

Figure 4:
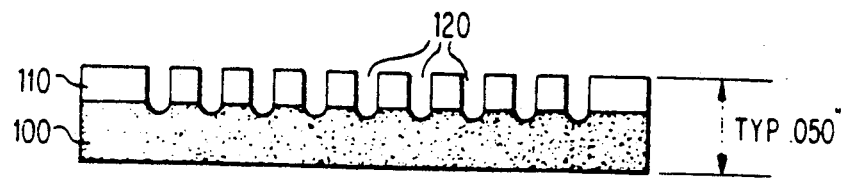
FIG. 4 shows an edge view of a typical assembly using a construction according to FIG. 3B.

As in the embodiment of FIGS. 3-5, laser bars 350 are mounted in grooves 340. The bars are dropped in place and soldered, as in the previous embodiment.

Figure 7B:
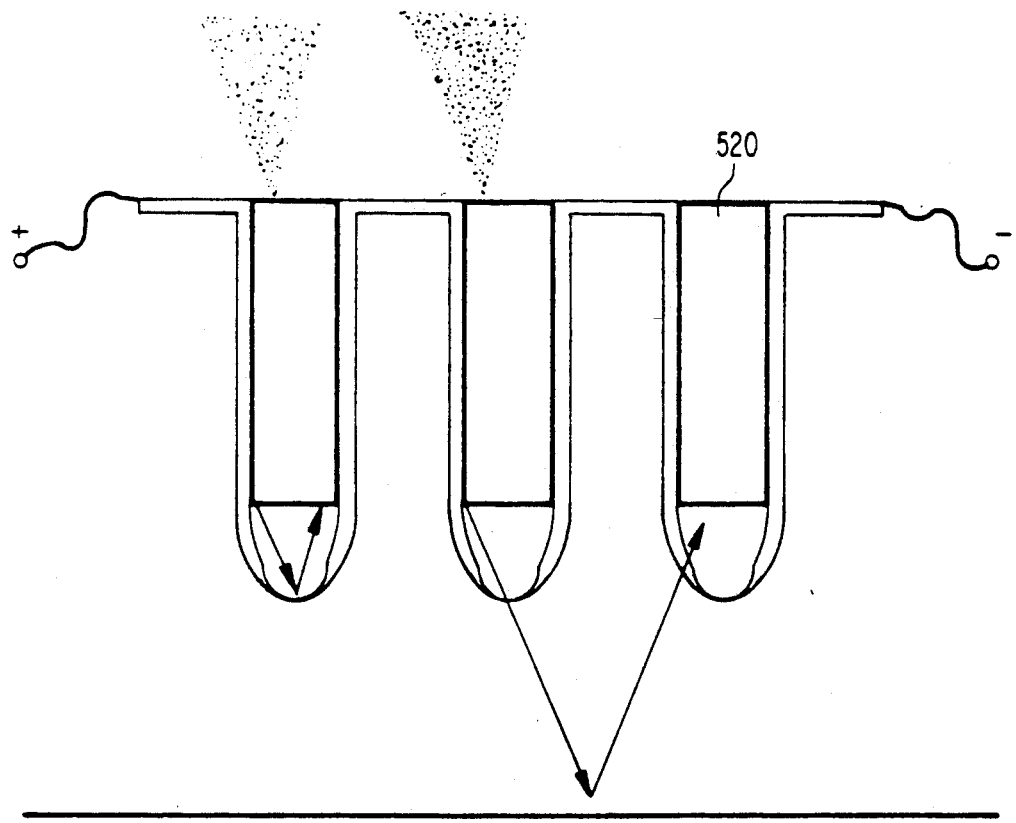

FIGS. 7A and 7B show a special embodiment of the invention, taking into account a special case where light is desired to be emitted toward the bottom of grooves. The utility of this embodiment is as follows. At present, a laser diode bar is comprised of individual emitters, each of which operates independently, resulting in the light emissions from a single bar being incoherent, or the individual light emissions being mixed, or out of phase.

It is desirable to make the individual emitters operate together, so that the light emissions would be coherent, and the light emitted from the bar would be in phase. One way of achieving this coherent emission would be to allow a small portion of the light to be emitted from the bottom of the laser bar. The light emitted from the bottom can interact with light from neighboring emitters to yield a coherent emission.

In addition, as more optically transparent mount materials become available, it may be possible not only for individual light emitters in a bar to interact with each other, but also for the bars themselves to interact with each other, yielding a higher level of coherence in the entire array.

In FIG. 7A, a lower nonconductive layer 500 has an upper conductive layer 510 formed thereon. Laser bars 520 are provided in these grooves. As can be seen going from left to right in the Figure, the laser bars 520 emit progressively less light toward the top of the array, and progressively more light toward the bottom. As indicated, such operation may be desirable in certain applications, to facilitate interaction among the array elements.

As shown in FIG. 7B, light emitted from elements on a single bar 520 may interact to provide coherence within that element. Also, light emitted from different elements may interact to provide additional coherence. The interaction between light from different elements is possible because, as seen in FIGS. 7A and 7B, the groove in which a bar 520 is placed is not surrounded entirely by conductive material. Rather, some portion at the bottom of the groove is left "open", so that the light can be emitted toward the bottom of the grooves.

Figure 1A:
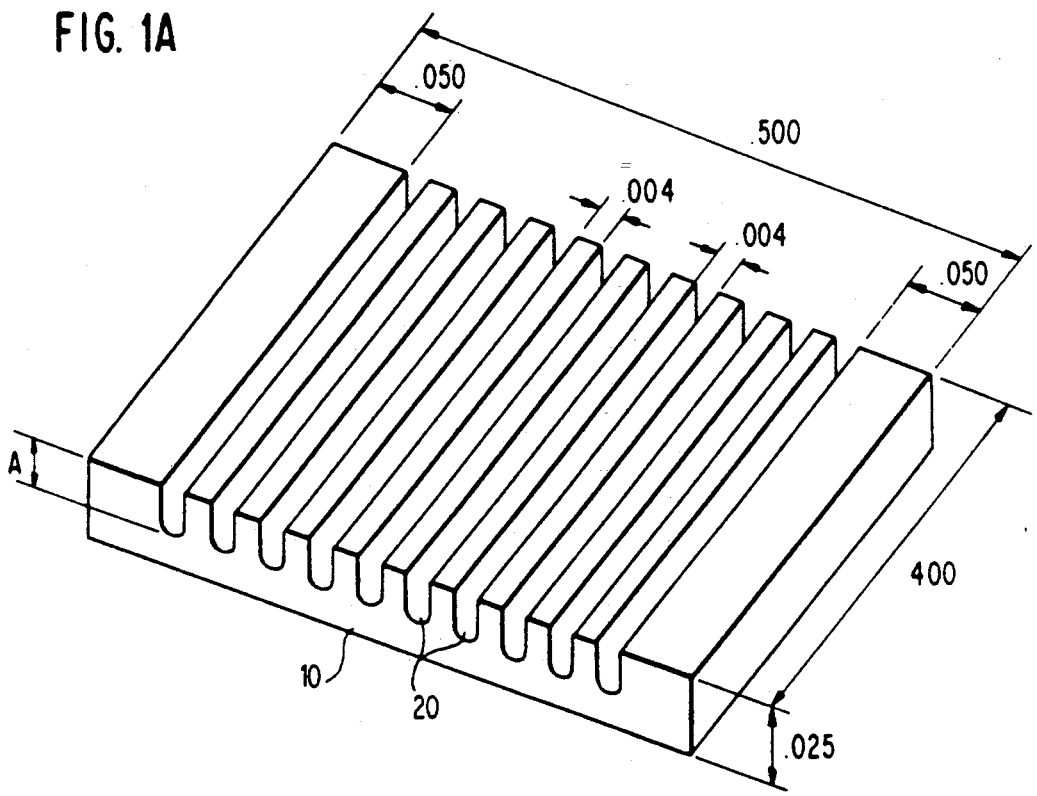
FIGS. 1A-1C show a monolithic substrate and monolithic laser diode array in accordance with the disclosure of the above-mentioned copending applications.
Figure 1B:
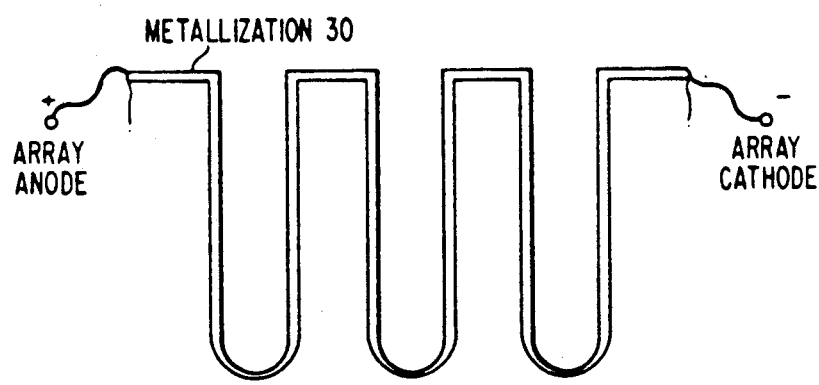
Figure 1C:
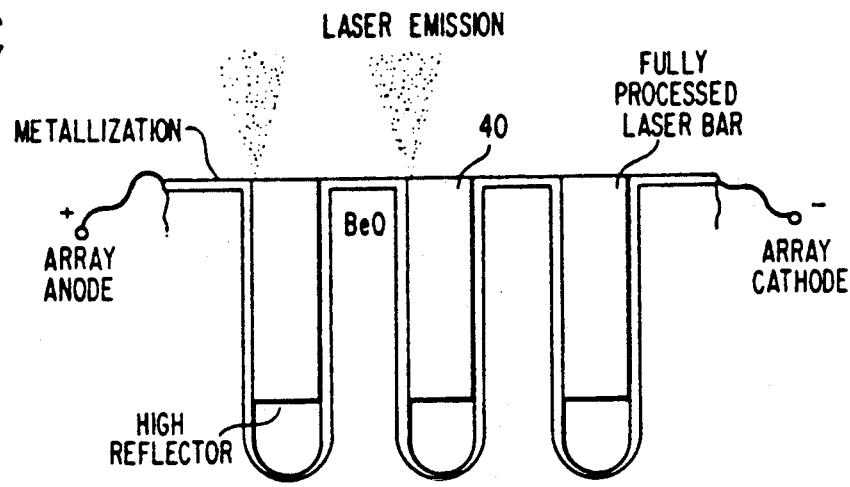
Figure 2A:
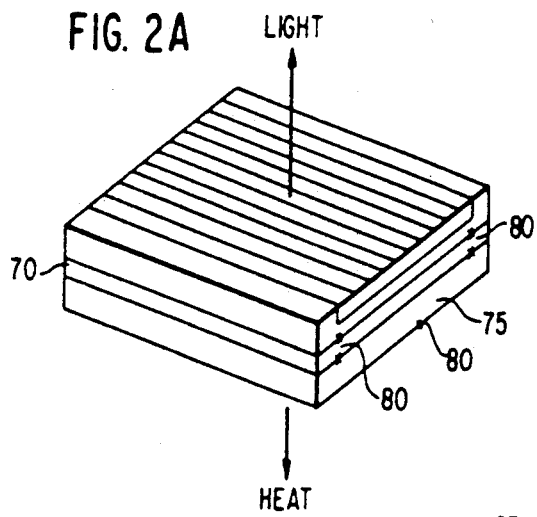
FIGS. 2A and 2B show the array of the copending applications with other laser structure forming a subassembly.
Figure 2B:
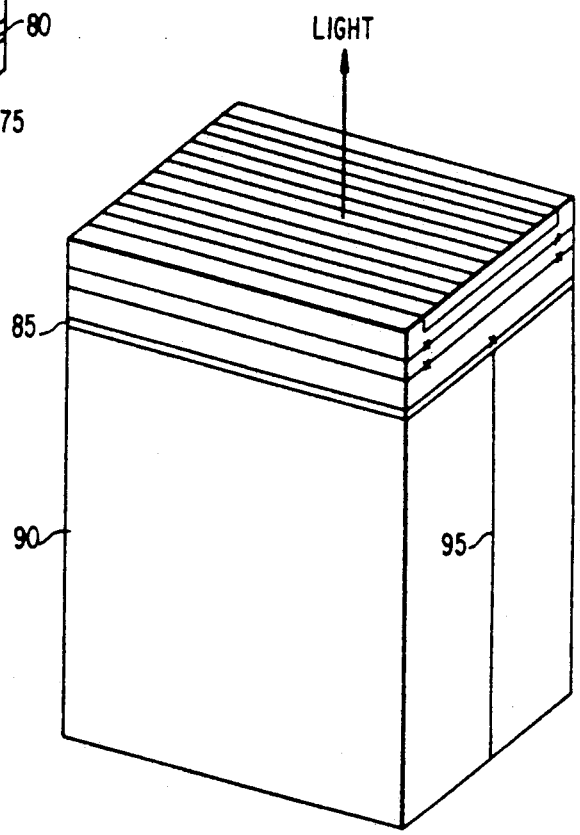

A laser diode array manufactured in accordance with any of the embodiments of FIGS. 3-7 preferably is used with the associated subassembly structure of FIGS. 2A and 2B, though other such cooling and powering structure is within the contemplation of the invention.

While the invention has been described in detail above with reference to a preferred embodiment, various modifications within the scope and spirit of the invention will be apparent to people of working skill in this technological field. Thus, the invention should be considered as limited only by the scope of the appended claims.

What is claimed is:

1. A laser diode array comprising:
   a substantially nonconductive lower substrate;
   a conductive layer formed over said substantially nonconductive substrate, a plurality of grooves being formed in said conductive layer; and
   a plurality of laser diodes disposed in said grooves, wherein said laser diodes are disposed substantially vertically in said grooves, such that an emission face of said diodes is parallel to a major surface of said conductive layer.

2. An array as claimed in claim 1, wherein said substantially nonconductive layer comprises a material selected from the group consisting of ceramic, diamond, AlN, BeO, silicon, and gallium arsenide.

3. An array as claimed in claim 1, wherein said conductive layer comprises a metal sheet.

4. An array as claimed in claim 1, wherein said conductive layer comprises a thin film layer.

5. An array as claimed in claim 1, wherein said conductive layer comprises a thick film layer.

6. An array as claimed in claim 1, wherein said conductive layer comprises a conductive semiconductor layer.

7. An array as claimed in claim 1, wherein said conductive layer comprises a plated layer.

8. An array as claimed in claim 1, wherein said laser diodes are mounted in said grooves such that at least a portion of the light emitted from said laser diodes is emitted in a direction toward a bottom of said array.

9. A monolithic laser diode array comprising:
   a monolithic substrate having upper and lower portions, said lower portion of said substrate being substantially undoped and electrically nonconductive, and said upper portion being highly doped and electrically conductive, a plurality of grooves being formed in said upper portion; and a plurality of laser diodes disposed in said grooves, wherein said laser diodes are disposed substantially vertically in said grooves, such that an emission face of said diodes is parallel to a major surface of said upper portion.

10. An array as claimed in claim 9, wherein said substrate comprises semiconductor material.

11. An array as claimed in claim 10, wherein said semiconductor material is silicon.

12. An array as claimed in claim 10, wherein said semiconductor material is gallium arsenide.

13. An array as claimed in claim 9, wherein said laser diodes are mounted in said grooves such that at least a portion of the light emitted therefrom is emitted toward a bottom of said array.

* * * * *